(12) United States Patent
Lee et al.

(10) Patent No.: US 12,180,584 B2
(45) Date of Patent: Dec. 31, 2024

(54) METHOD OF FABRICATING HEXAGONAL BORON NITRIDE

(71) Applicants: Samsung Electronics Co., Ltd., Suwon-si (KR); UNIST (ULSAN NATIONAL INSTITUTE OF SCIENCE AND TECHNOLOGY), Ulsan (KR)

(72) Inventors: Changseok Lee, Seoul (KR); Hyeonsuk Shin, Ulsan (KR); Hyeonjin Shin, Suwon-si (KR); Seokmo Hong, Ulsan (KR); Kyungyeol Ma, Ulsan (KR)

(73) Assignees: Samsung Electronics Co., Ltd., Gyeonggi-do (KR); UNIST (Ulsan National Institute of Science and Technology), Ulsan (KR)

( * ) Notice: Subject to any disclaimer, the term of this patent is extended or adjusted under 35 U.S.C. 154(b) by 190 days.

(21) Appl. No.: 16/885,887

(22) Filed: May 28, 2020

(65) Prior Publication Data

US 2021/0066069 A1 Mar. 4, 2021

(30) Foreign Application Priority Data

Sep. 3, 2019 (KR) .................. 10-2019-0108930

(51) Int. Cl.
*C30B 25/10* (2006.01)
*C01B 21/064* (2006.01)
(Continued)

(52) U.S. Cl.
CPC ........ *C23C 16/342* (2013.01); *C01B 21/0641* (2013.01); *C23C 16/0227* (2013.01);
(Continued)

(58) Field of Classification Search
CPC . C01B 21/0641; C23C 16/342; C30B 25/105; C30B 25/165; C30B 25/18;
(Continued)

(56) References Cited

U.S. PATENT DOCUMENTS 6,159,625 A * 12/2000 Ueno ............... G11B 5/737
204/192.2
8,790,775 B2 7/2014 Kim et al.
(Continued)

FOREIGN PATENT DOCUMENTS

CN 106245001 A 12/2016
EP 3225720 A1 10/2017
(Continued)

OTHER PUBLICATIONS

European Patent Office, English computer translation of KR20170038499. (Year: 2022).*
(Continued)

*Primary Examiner* — Matthew J Song
(74) *Attorney, Agent, or Firm* — HARNESS, DICKEY & PIERCE, P.L.C.

(57) ABSTRACT

Disclosed herein is a method of fabricating hexagonal boron nitride in which hexagonal boron nitride is epitaxially grown. A method of fabricating hexagonal boron nitride includes placing a catalytic metal in a chamber, the catalytic metal having a hexagonal crystal structure and having a lattice mismatch of 15% or less with hexagonal boron nitride (h-BN) in a chamber; and growing hexagonal boron nitride on the catalytic metal at a temperature of 800° C. or lower while supplying a nitrogen source and a boron source into the chamber.

18 Claims, 15 Drawing Sheets

(51) Int. Cl.
    *C23C 16/02*     (2006.01)
    *C23C 16/34*     (2006.01)
    *C23C 16/50*     (2006.01)
    *C30B 25/16*     (2006.01)
    *C30B 29/40*     (2006.01)
    *H01L 21/02*     (2006.01)
    *H01L 29/08*     (2006.01)
    *H01L 29/417*     (2006.01)

(52) U.S. Cl.
CPC ............ *C23C 16/50* (2013.01); *C30B 25/105* (2013.01); *C30B 25/165* (2013.01); *C30B 29/403* (2013.01); *H01L 21/0254* (2013.01); *H01L 21/02598* (2013.01); *H01L 21/02609* (2013.01); *H01L 21/0262* (2013.01); *H01L 29/0847* (2013.01); *H01L 29/41725* (2013.01)

(58) Field of Classification Search
CPC ... C30B 29/40; C30B 29/403; H01L 21/0254; H01L 21/02598
See application file for complete search history.

(56) References Cited

U.S. PATENT DOCUMENTS

| | | | |
|---|---|---|---|
| 10,240,253 B2 | 3/2019 | Hwang | |
| 2006/0163527 A1* | 7/2006 | Komatsu | C23C 14/28 427/532 |
| 2011/0256386 A1 | 10/2011 | Shi et al. | |
| 2012/0063033 A1* | 3/2012 | Gurney | G11B 5/3903 360/234.3 |
| 2013/0140526 A1* | 6/2013 | Kim | C01B 21/064 257/29 |
| 2014/0239256 A1* | 8/2014 | Kim | H01L 21/02491 257/29 |
| 2014/0264282 A1* | 9/2014 | Lee | H01L 21/02425 257/29 |
| 2015/0167148 A1 | 6/2015 | Sutter et al. | |
| 2017/0268123 A1 | 9/2017 | Hwang | |
| 2022/0165568 A1* | 5/2022 | Kabuki | C23C 16/38 |
| 2022/0262903 A1 | 8/2022 | Lee et al. | |

FOREIGN PATENT DOCUMENTS

| | | | | |
|---|---|---|---|---|
| JP | 2007329354 A | * | 12/2007 | ........... H01L 21/205 |
| KR | 10-2013-0032536 A | | 4/2013 | |
| KR | 2013/0063410 A | | 6/2013 | |
| KR | 2016-0077237 A | | 7/2016 | |
| KR | 10-2016-0137298 A | | 11/2016 | |
| KR | 101692514 B1 | | 1/2017 | |
| KR | 2017-0038499 A | | 4/2017 | |
| KR | 101797182 B1 | | 11/2017 | |
| KR | 2023/0063410 A | | 5/2023 | |

OTHER PUBLICATIONS

European Patent Office, English computer translation of JP 2007-329354 (Year: 2023).*

Qi et al, "Strong Adlayer-Substrate Interactions "Break" the Patching Growth of h-BN onto Graphene on Re(0001)," ACS Nano 2017, 11, p. 1807-1815 (Year: 2017).*

Francesco Bonaccorso et al., 'Production and processing of graphene and 2d crystals' *Materials Today*, vol. 15, No. 12, Dec. 2012, pp. 564-589.

Chinese Office Action dated Nov. 15, 2023 for corresponding Chinese Patent Application No. 202010787644.5 and its English-language translation.

Korean Office Action dated Mar. 7, 2024 for corresponding Korean Patent Application No. 10-2019-0108930 and its English-language translation.

Chinese Office Action dated Nov. 5, 2024 for corresponding Chinese Patent Application No. 202010787644.5 and its English-language translation.

* cited by examiner

METHOD OF FABRICATING HEXAGONAL BORON NITRIDE

CROSS-REFERENCE TO RELATED APPLICATION

This application claims the benefit of Korean Patent Application No. 10-2019-0108930, filed on Sep. 3, 2019, in the Korean Intellectual Property Office, the disclosure of which is incorporated herein in its entirety by reference.

BACKGROUND

1. Field

The present disclosure relates to a method of fabricating hexagonal boron nitride (h-BN), and more particularly, to a method of fabricating hexagonal boron nitride in which hexagonal boron nitride is epitaxially grown at a relatively low temperature.

2. Description of Related Art

Hexagonal boron nitride, which is a material having a two-dimensional structure, has a hexagonal arrangement of boron atoms and nitrogen atoms, has electrical insulating properties due to high bandgap energy of about 5.9 eV, and is chemically and physically stable.

Hexagonal boron nitride crystals have very strong covalent bonds and have lubricity. Further, since hexagonal boron nitride has high thermal conductivity, may not have a melting point, and sublimes at about 3,000° C., it has high stability at high temperature and has very high electrical resistance of 105Ω at a high temperature range of 1000° C. or higher. Such hexagonal boron nitride may be mainly used for applications such as an insulating film, an anti-diffusion film, or a surface antioxidant film in an electric device or an electronic device. Further, hexagonal boron nitride may be used to make a substrate for the growth of other two-dimensional materials. Further, hexagonal boron nitride may be used to lighten parts because it has a low specific gravity of 2.26.

Such hexagonal boron nitride is generally grown using thermo-chemical vapor deposition (T-CVD) at a high temperature of about 1,000° C. to about 1,500° C.

SUMMARY

According to an aspect, there is provided a method of fabricating hexagonal boron nitride, the method including: placing a catalytic metal in a chamber, the catalytic metal having a hexagonal crystal structure and having a lattice mismatch of greater than 0% and less than or equal to 15% with hexagonal boron nitride (h-BN) in a chamber; and growing hexagonal boron nitride on the catalytic metal at a temperature of 800° C. or lower while supplying a nitrogen source and a boron source into the chamber.

In some embodiments, the catalytic metal may include crystals of at least one of cobalt (Co), a Co—Cr alloy, a Co—N alloy, a Co—Ir alloy, zinc (Zn), ruthenium (Ru), technetium (Tc), osmium (Os), and rhenium (Re).

Additional aspects will be set forth in part in the description which follows and, in part, will be apparent from the description, or may be learned by practice of the presented embodiments of the disclosure.

In some embodiments, the nitrogen source and the boron source may include at least one of borazine, 1,3,5-trimethylborazine, 2,4,6-trimethylborazine, aminoborane, 2,4,6-trichloroborazine, B-tri(methylamino)borazine, and ammonia borane, which are compounds of boron and nitrogen.

In some embodiments, the nitrogen source may include at least one of ammonia ($NH_3$) gas and nitrogen ($N_2$) gas.

Further, in some embodiments, the boron source may include at least one material selected from $BH_3$, $BF_3$, $BCl_3$, $B_2H_6$, $(CH_3CH_2)_3B$, and $(CH_3)_3B$.

In some embodiments, the nitrogen source and the boron source may be provided by vaporizing solid boron nitride powder.

In some embodiments, method may further include: removing pollutants from a surface of the catalytic metal before growing the hexagonal boron nitride.

In some embodiments, the removing the pollutants from the surface of the catalytic metal may include: supplying hydrogen ($H_2$) gas into the chamber and increasing a temperature in the chamber to 1,000° C.

In some embodiments, the removing the pollutants may be performed for 20 minutes while supplying the hydrogen gas at a flow rate of 100 sccm.

In some embodiments, the growing the hexagonal boron nitride may be performed by inductively coupled plasma chemical vapor deposition.

In some embodiments, the growing the hexagonal boron nitride may be performed at a temperature ranging from about 350° C. to about 800° C.

In some embodiments, the growing the hexagonal boron nitride may include: supplying hydrogen ($H_2$) gas into the chamber at a flow rate of 0 sccm to 100 sccm, supplying argon (Ar) gas into the chamber at a flow rate of 0 sccm to 100 sccm, supplying borazine gas into the chamber at a flow rate of about 0.01 sccm to about 1 sccm, and maintaining pressure in the chamber at about 0.01 Torr to about 1 Torr.

In some embodiments, the lattice mismatch of the catalytic metal and the hexagonal boron nitride may be greater than 0% and less than or equal to 10.4%.

In some embodiments, the growing the hexagonal boron nitride may provide a grown hexagonal boron nitride that may have a monocrystalline structure.

In some embodiments, a root mean square surface roughness of the grown hexagonal boron nitride may be greater than 0 nm and less than or equal to 2 nm.

Further, the root mean square surface roughness of the grown hexagonal boron nitride may be greater than 0 nm and less than or equal to 1.7 nm.

According to another aspect, there is provided a hexagonal boron nitride, fabricated by one of the above-described methods. The hexagonal boron nitride may have a monocrystalline structure and having a root mean square surface roughness of greater than 0 nm and less than or equal to 2 nm.

According to another aspect, there is provided an electric device, including: the hexagonal boron nitride fabricated by one of the aforementioned methods; and a two-dimensional material on the hexagonal boron nitride.

In some embodiments, the two-dimensional material may include graphene, transition metal dichalcogenide, black phosphorus, or phosphorene.

According to another aspect, a semiconductor device includes a substrate including a source region and a drain region that each include a doped semiconductor; a first hexagonal boron nitride and a second hexagonal boron nitride fabricated by one of the above-described methods and being on the substrate, the first hexagonal boron nitride being on the source region, the second hexagonal boron nitride being on the drain region; a source electrode on the first hexagonal boron nitride; and a drain electrode on the second hexagonal boron nitride.

According to an aspect, a method of fabricating hexagonal boron nitride is provided. The method includes placing a catalytic metal in a chamber, the catalytic metal having a hexagonal crystal structure and including crystals of at least one of cobalt (Co), an Co—Cr alloy, a Co—N alloy, a Co—Ir alloy, zinc (Zn), ruthenium (Ru), technetium (Tc), osmium (Os), and rhenium (Re); and growing hexagonal boron nitride on the catalytic metal at a temperature in a range of about 350° C. to about 800° C. while supplying a nitrogen source and a boron source into the chamber.

In some embodiments, the growing hexagonal boron nitride may include: supplying hydrogen ($H_2$) gas into the chamber at a flow rate of 0 sccm to 100 sccm, supplying argon (Ar) gas into the chamber at a flow rate of 0 sccm to 100 sccm, supplying borazine gas into the chamber at a flow rate of 0.01 sccm to 1 sccm, and maintaining pressure in the chamber at 0.01 Torr to 1 Torr.

In some embodiments, the growing hexagonal boron nitride is performed by inductively coupled plasma chemical vapor deposition.

In some embodiments, the method may further include removing pollutants from a surface of the catalytic metal before growing the hexagonal boron nitride.

In some embodiments, the nitrogen source and the boron source may include at least one of borazine, 1,3,5-trimethylborazine, 2,4,6-trimethylborazine, aminoborane, 2,4,6-trichloroborazine, B-tri(methylamino)borazine, and ammonia borane.

BRIEF DESCRIPTION OF THE DRAWINGS

The above/and other aspects, features, and advantages of certain embodiments of the disclosure will be more apparent from the following description taken in conjunction with the accompanying drawings, in which.

DETAILED DESCRIPTION

Figure 1:
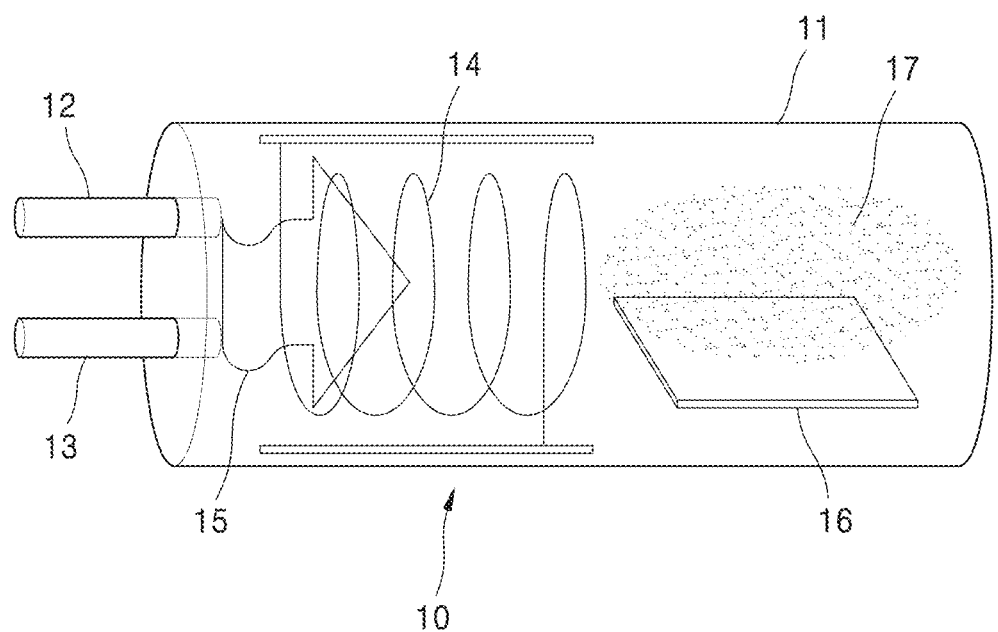
FIG. 1 is a schematic view of a system for fabricating hexagonal boron nitride according to an embodiment.

Reference will now be made in detail to embodiments, examples of which are illustrated in the accompanying drawings, wherein like reference numerals refer to like elements throughout. In this regard, embodiments of inventive concepts may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items.

Expressions such as "at least one of," when preceding a list of elements, modify the entire list of elements and do not modify the individual elements of the list. Expressions such as "at least one of," when preceding a list of elements (e.g., A, B, and C), modify the entire list of elements and do not modify the individual elements of the list. For example, "at least one of A, B, and C," "at least one of A, B, or C," "one of A, B, C, or a combination thereof," and "one of A, B, C, and a combination thereof," respectively, may be construed as covering any one of the following combinations: A; B; A and B; A and C; B and C; and A, B, and C."

Hereinafter, a method of fabricating hexagonal boron nitride will be described in detail with reference to the accompanying drawings. In the following drawings, like reference numerals refer to like elements, and the size of each element may be exaggerated for clarity and convenience of explanation. Further, the following embodiments are merely illustrative, and may be variously modified. Further, in the following layer structures, the expressions "over" or "on" may include not only being in contact directly on/under/left/right but also not being in contact above/below/left/right.

Hexagonal boron nitride (h-BN) includes boron atoms and nitrogen atoms that are alternately arranged in a planar hexagonal crystal structure. Hexagonal boron nitride has an interlayer structure in which adjacent boron atoms and nitrogen atoms overlap each other due to the polarity of the two atoms. Hexagonal boron nitride may be used for various applications because it is very inactive in an oxidizing atmosphere, has high thermal conductivity and high electrical insulating properties, and has stable chemical properties. The present disclosure provides a method of epitaxially growing hexagonal boron nitride at a relatively low temperature.

For example, FIG. 1 is a schematic view of a system for fabricating hexagonal boron nitride according to an embodiment. Referring to FIG. 1, hexagonal boron nitride may be grown using an inductively coupled plasma chemical vapor deposition (ICP-CVD) system 10. The inductively coupled plasma chemical vapor deposition system 10 may include a chamber 11 in which reaction occurs, source inlets 12 and 13 for providing source gas 15 into the chamber 11, and a coil 14 for ionizing the source gas 15 introduced into the chamber 11 and generating plasma 17. The coil 14 may be located in the chamber 11 or may be located outside the chamber 11. The inductively coupled plasma chemical vapor deposition system 10 may have other various structures. However, the detailed structure of the inductively coupled plasma chemical vapor deposition system 10 is beyond the scope of the present embodiment, and thus a detailed description thereof will be omitted.

First, according to an embodiment, a catalytic metal 16 is placed in the chamber 11. The catalytic metal 16 may have a flat thin film form. The catalytic metal 16 may include a metal material having the same hexagonal crystal structure as hexagonal boron nitride. In particular, the catalytic metal 16 may include a metal material having a lattice mismatch of 15% or less (e.g., greater than or equal to 0% and less than or equal to 15%) with hexagonal boron nitride. For example, the catalytic metal 16 may include crystals of at least one material selected from cobalt (Co), an Co—Cr alloy, a Co—N alloy, a Co—Ir alloy, zinc (Zn), ruthenium (Ru), technetium (Tc), osmium (Os), and rhenium (Re). For example, the lattice constant of hexagonal boron nitride is about 250 pm (picometer), and the lattice constant of rhenium (Re) is about 276.1 pm, so that the lattice mismatch between rhenium (Re) and hexagonal boron nitride is about 10.4%. Further, the lattice constant of cobalt (Co) having the lowest lattice mismatch of about 0.3% with hexagonal boron nitride is about 250.71 pm. Accordingly, the scope of the metal material may be further restricted such that a metal material having a lattice mismatch of 10.4% or less with hexagonal boron nitride may be used as the catalytic metal 16.

In order for the catalytic metal 16 to have a hexagonal crystal structure, a catalytic metal 16 previously grown on a growth substrate (not shown) having a hexagonal crystal structure may be used. For example, a catalytic metal 16 obtained by growing the aforementioned metal layer on an aluminum oxide ($Al_2O_3$) substrate at an appropriate temperature. The growth temperature condition for allowing the catalytic metal 16 to have a hexagonal crystal structure may be changed depending on the metal material. Although the catalytic metal 16 is detached from the growth substrate and only the catalytic metal 16 is placed in the chamber 11, both the growth substrate and the catalytic metal 16 may be placed in the chamber 11.

Further, before the catalytic metal 16 is placed in the chamber 11, selectively, the surface of the catalytic metal 16 may be processed to improve smoothness. For example, as a polishing process, at least one of chemical polishing, physical polishing, chemical-mechanical polishing, and electropolishing may be used.

After the catalytic metal 16 is placed in the chamber 11, selectively, pollutants such as carbon may be removed from the surface of the catalytic metal 16. For example, in a hydrogen atmosphere, pollutants such as carbon existing on the surface of the catalytic metal 16 may be removed by bonding with hydrogen. For example, the temperature in the chamber 11 may be increased to 1,000° C. while supplying hydrogen gas ($H_2$) into the chamber 11 at a flow rate of about 100 sccm. The process of removing the pollutants may be performed for about 20 minutes. No current is applied to the coil 14 while removing the pollutants. If there is little contaminant on the surface of the catalytic metal 16, the process of removing these pollutants may be omitted.

After the pollutants are removed from the surface of the catalytic metal 16, hexagonal boron nitride may be grown on the catalytic metal 16 by inductively coupled plasma chemical vapor deposition. According to the present embodiment, hexagonal boron nitride may be grown on the catalytic metal 16 at a temperature of 800° C. or lower while supplying a nitrogen source and a boron source into the chamber 11. For this purpose, the nitrogen source and the boron source are provided into the chamber 11 together with hydrogen gas ($H_2$) or a mixture ($Ar/H_2$) of argon gas and hydrogen gas while maintaining the temperature in the chamber 11 at 800° C. or lower. Simultaneously, a current is applied to the coil 14.

A compound of nitrogen and boron may be used as the nitrogen source and the boron source. For example, the compound of nitrogen and boron may include at least one material selected from borazine $((BH)_3(NH)_3)$, aminoborane ($NH_2BH_2$), ammonia borane ($H_3NBH_3$) 1,3,5-trimethylborazine ($C_3H_{12}B_3N_3$), 2,4,6-trimethylborazine, 2,4,6-trichloroborazine ($B_3Cl_3H_3N_3$), and B-tri(methylamino)borazine ($B_{3.0}N_{4.4\pm0.1}C_{2.0\pm0.1}H_{9.3\pm0.2}$). Alternatively, the compound of nitrogen and boron may be provided into the chamber 11 by vaporizing solid boron nitride powder.

Further, a nitrogen precursor, as the nitrogen source, may be provided into the chamber 11, and a boron precursor, as the boron source, may be provided into the chamber 11. The nitrogen precursor may include, for example, at least one material selected from ammonia ($NH_3$) gas and nitrogen ($N_2$) gas. Further, the boron precursor includes at least one material selected from borane ($BH_3$), boron trifluoride ($BF_3$), boron trichloride ($BCl_3$), $B_2H_6$, $(CH_3CH_2)_3B$, and $(CH_3)_3B$.

The nitrogen source and the boron source are ionized by an electric field inside the coil 14 while passing through the inside of the chamber 11. As a result, the nitrogen source and the boron source are present in the state of plasma 17 in the chamber 11. Thereafter, nitrogen atoms and boron atoms in the state of plasma 17 are coupled with each other to grow crystals of hexagonal boron nitride.

For example, when hexagonal boron nitride is fabricated using borazine, the temperature in the chamber 11 may be maintained at about 800° C. or lower. Further, borazine may be supplied into the chamber 11 at a flow rate of about 0.01 sccm to about 1 sccm while applying power of about 500 W or less to the coil 14. Simultaneously, hydrogen ($H_2$) gas may be supplied into the chamber 11 at a flow rate of about 0 sccm to about 100 sccm, and argon (Ar) gas may be supplied into the chamber 11 at a flow rate of about 0 sccm to about 100 sccm. In this case, the pressure in the chamber 11 may maintain about 0.01 Torr to about 1 Torr.

Figure 2:
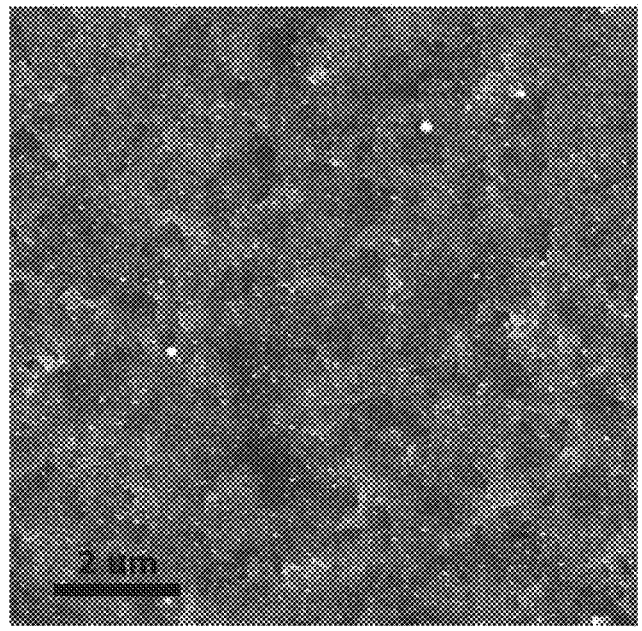
FIG. 2 is an atomic force microscope photograph of the surface of the hexagonal boron nitride fabricated by the system of FIG. 1.

FIG. 2 is an atomic force microscope photograph of the surface of the hexagonal boron nitride fabricated by the system of FIG. 1. For example, the hexagonal boron nitride of FIG. 2 is fabricated at a temperature of about 390° C. using cobalt grown to a thickness of 500 nm on an aluminum oxide substrate as the catalytic metal 16. Referring to FIG. 2, it may be found that hexagonal boron nitride having a relatively smooth and uniform surface was formed. The hexagonal boron nitride fabricated in this way was measured to have a root mean square (RMS) surface roughness of about 2 nm or less, more precisely about 1.7 nm or less.

Figure 3:
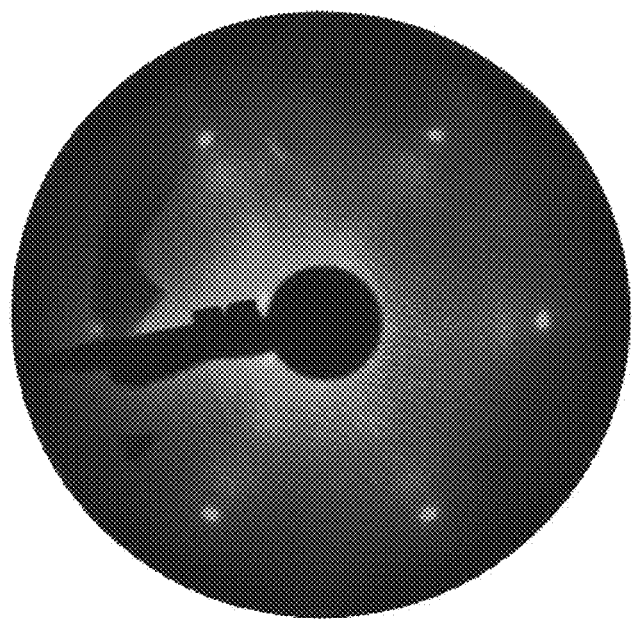
FIG. 3 shows the low-energy electron diffraction measurement results of the hexagonal boron nitride fabricated by the system of FIG. 1.

FIG. 3 shows the measurement results of the hexagonal boron nitride fabricated by the aforementioned method using low-energy electron diffraction (LEED). Referring to FIG. 3, as a result of the LEED measurement, six diffraction spots arranged in one hexagonal pattern form were found. This means that the hexagonal boron nitride formed by the aforementioned method has a mono-crystalline structure. Therefore, the hexagonal boron nitride formed by the aforementioned method may have high quality.

Figure 4:
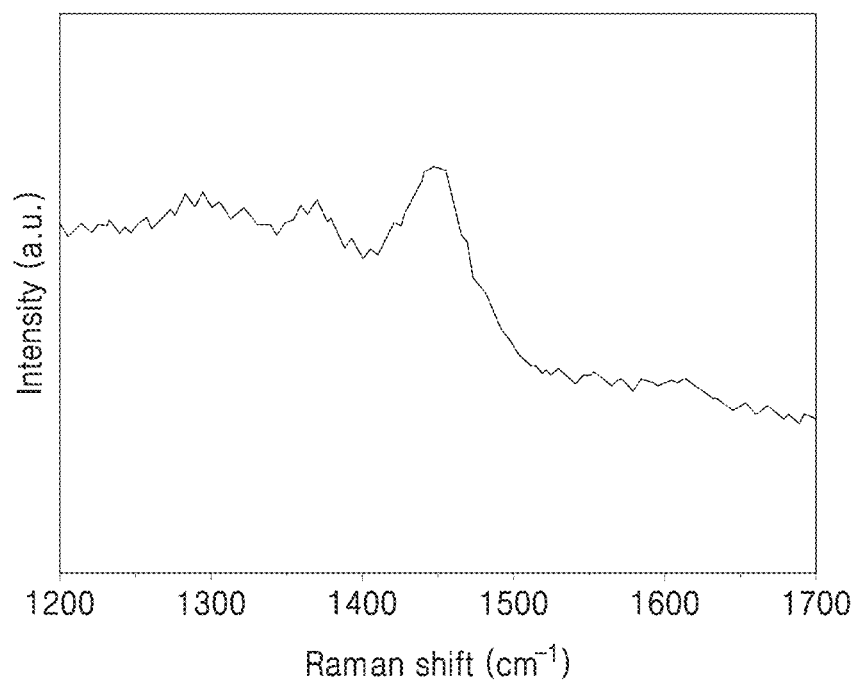
FIG. 4 is a graph showing the Raman spectrum measurement results of hexagonal boron nitride grown at a temperature of 400° C.
Figure 5:
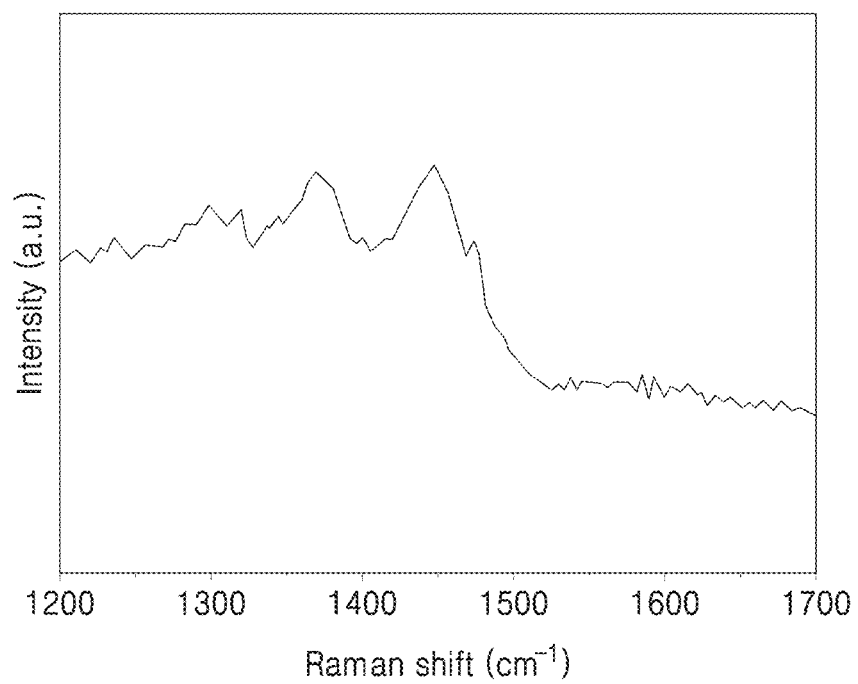
FIG. 5 is a graph showing the Raman spectrum measurement results of hexagonal boron nitride grown at a temperature of 500° C.
Figure 6:
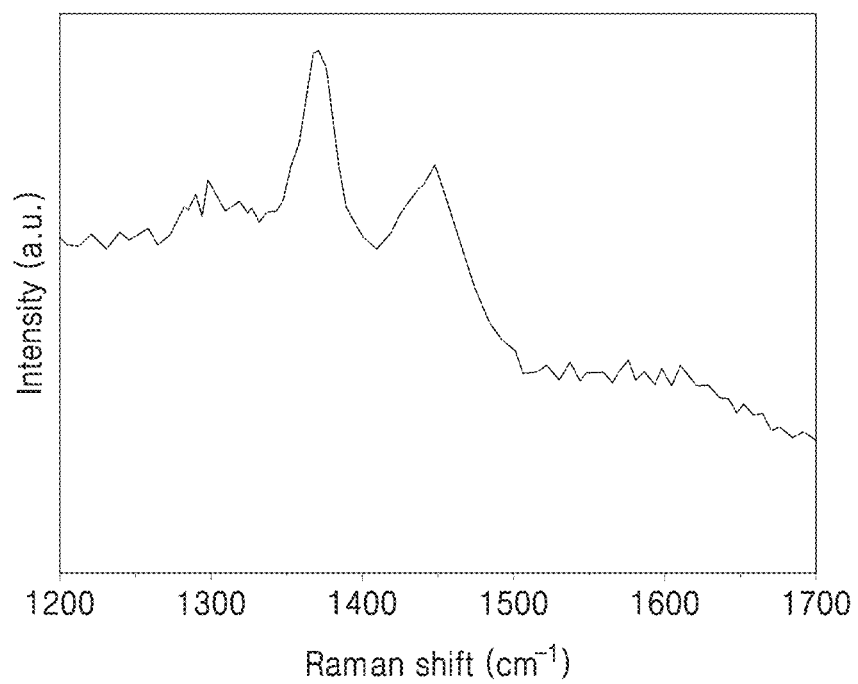
FIG. 6 is a graph showing the Raman spectrum measurement results of hexagonal boron nitride grown at a temperature of 600° C.
Figure 7:
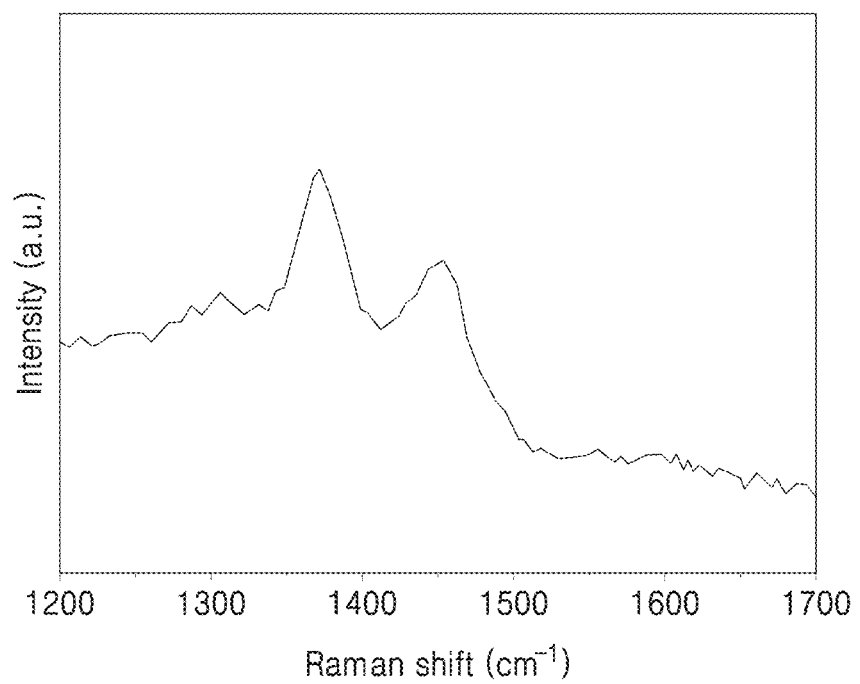
FIG. 7 is a graph showing the Raman spectrum measurement results of hexagonal boron nitride grown at a temperature of 800° C.

FIGS. 4 to 7 are graphs showing the Raman spectrum measurement results of hexagonal boron nitrides grown at different temperatures. FIG. 4 is a graph showing the Raman spectrum measurement results of hexagonal boron nitride grown at a temperature of 400° C., FIG. 5 is a graph showing the Raman spectrum measurement results of hexagonal boron nitride grown at a temperature of 500° C., FIG. 6 is a graph showing the Raman spectrum measurement results of hexagonal boron nitride grown at a temperature of 600° C., and FIG. 7 is a graph showing the Raman spectrum measurement results of hexagonal boron nitride grown at a temperature of 800° C.

Referring to FIG. 4, it may be found that a peak of the Raman spectrum appears at about 1370 cm$^{-1}$. Raman spectra have different peaks depending on the kind of materials. Since hexagonal boron nitride has an inherent peak at 1370 cmt, it may be confirmed that hexagonal boron nitride may be fabricated even at a temperature of about 400° C. However, in the graph of FIG. 4, peaks are also seen at positions other than 1370 cm$^{-1}$. This means that heterogeneous components of cubic boron nitride (c-BN), amorphous boron nitride (a-BN), boron nitride carbon ($B_xC_yN_z$) or BN soot are partially formed in addition to heterogeneous components of hexagonal boron nitride. Sequentially referring to FIGS. 5 to 7, as the growth temperature of hexagonal boron nitride increases, a certain peak appears at 1370 cm$^{-1}$. In particular, in the case of hexagonal boron nitride grown at 600° C. and 800° C., the intensity of the peak at 1370 cm$^{-1}$ is much stronger than that of other peaks.

As may be found from the measurement results of FIGS. 2 to 7, according to the present embodiment, when a catalytic metal having a lattice mismatch of about 15% or less with hexagonal boron nitride is used, hexagonal boron nitride may be grown even at a low temperature of about 800° C. or lower. For example, hexagonal boron nitride may be grown within a temperature range of about 350° C. to about 800° C. Accordingly, since the growth temperature of hexagonal boron nitride is low, the process cost for fabricating hexagonal boron nitride may be reduced and the production cost of hexagonal boron nitride may be reduced.

Further, since the hexagonal boron nitride fabricated by the method of the present embodiment may have a monocrystalline structure, the quality of hexagonal boron nitride may be improved. For example, when hexagonal boron nitride having a polycrystalline structure is used as an anti-diffusion film or surface antioxidant film of an electrical device or an electronic device, a dopant or hydrogen may penetrate into crystal defects of hexagonal boron nitride. In this case, the performance of the anti-diffusion film or the surface antioxidant film may be degraded. Hexagonal boron nitride having a mono-crystalline structure may improve the performance of the anti-diffusion film or the surface antioxidant film.

Figure 8:
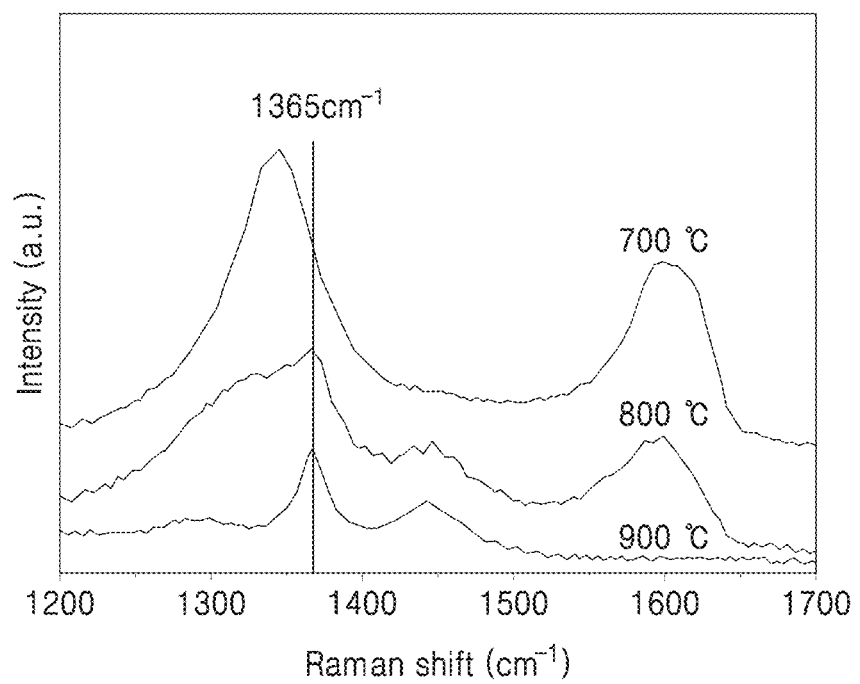
FIG. 8 is a graph showing the Raman spectrum measurement results of hexagonal boron nitride grown by the method according to Comparative Example 1.

Meanwhile, FIG. 8 is a graph showing the Raman spectrum measurement results of hexagonal boron nitride grown by the method according to Comparative Example 1. The hexagonal boron nitride according to Comparative Example 1 was fabricated by ICP-CVD at 700° C., 800° C., and 900° C. using platinum (Pt) crystals having a face-centered cubic structure as a catalytic metal. Further, in Comparative Example 1, pollutants were not removed from the surface of the platinum catalytic metal. Referring to the graph of FIG. 8, in the hexagonal boron nitride fabricated at 700° C., no peak appeared at 1370 cm$^{-1}$, and in the hexagonal boron nitride fabricated at 800° C. and 900° C., a weak peak appeared at about 1365 cm$^{-1}$.

Figure 9:
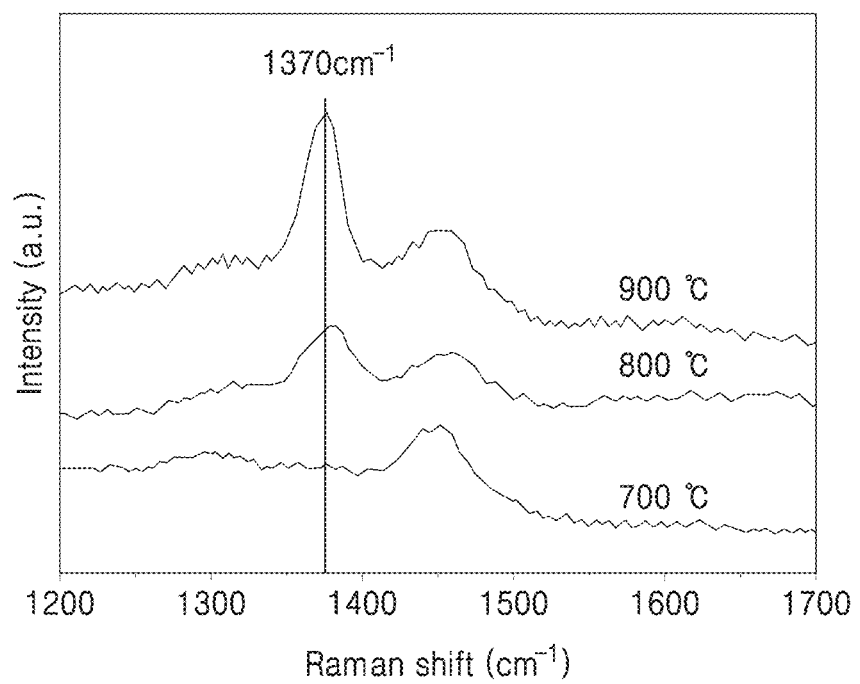
FIG. 9 is a graph showing the Raman spectrum measurement results of hexagonal boron nitride grown by the method according to Comparative Example 2.

Further, FIG. 9 is a graph showing the Raman spectrum measurement results of hexagonal boron nitride grown by the method according to Comparative Example 2 In Comparative Example 2, pollutants were removed from the surface of a catalytic metal at a temperature of 1000° C. in a hydrogen atmosphere. Besides, hexagonal boron nitride was fabricated under the same conditions as those in Comparative Example 1. Referring to the graph of FIG. 9, in the hexagonal boron nitride fabricated at 700° C., no peak appeared at 1370 cm$^{-1}$, in the hexagonal boron nitride fabricated at 800° C., a weak peak appeared at about 1370 cm$^{-1}$, and in the hexagonal boron nitride fabricated at 900° C., a relatively strong peak appeared at about 1370 cmt. Accordingly, it may be found that platinum (Pt), which is mainly used as a catalytic metal when fabricating hexagonal boron nitride by conventional thermochemical vapor deposition (T-CVD), is not suitable for growing hexagonal boron nitride at 800° C. or lower by the method according to the present embodiment.

The hexagonal boron nitride fabricated by the aforementioned method according to the present embodiment may be usefully used as a passivation film such as an anti-diffusion film or a surface antioxidant film. In this case, since the hexagonal boron nitride has a mono-crystalline structure, the performance of the passivation film may be improved. Further, hexagonal boron nitride may be used as a substrate for growth of other two-dimensional materials such as graphene.

For example, when hexagonal boron nitride may be used as a substrate for growth of other two-dimensional materials, the catalytic metal 16 under the hexagonal boron nitride may be removed. For example, the catalytic metal 16 may be removed by an acidic solution. When a hexagonal boron nitride thin film is coated with a support member, for example, polymethyl methacrylate (PMMA) prior to acid treatment, and then the catalytic metal 16 is removed, a subsequent transfer process of hexagonal boron nitride may be facilitated.

Hexagonal boron nitride has less lattice mismatch with graphene. Therefore, when the hexagonal boron nitride thin film is transferred onto a catalytic metal for graphene and then graphene is formed by CVD, high-quality graphene may be obtained. In addition to graphene, other two-dimensional materials such as black phosphorus (BP), phosphorene, which is a two-dimensional allotrope, and transition metal dichalcogenide (TMDC), which is a compound of transition metal and chalcogen element, may be grown on hexagonal boron nitride. For example, transition metal dichalcogenide such as $MoS_2$, $WS_2$, $TaS_2$, $HfS_2$, $ReS_2$, $TiS_2$, $NbS_2$, $SnS_2$, $MoSe_2$, $WSe_2$, $TaSe_2$, $HfSe_2$, $ReSe_2$, $TiSe_2$, $NbSe_2$, $SnSe_2$, $MoTe_2$, $WTe_2$, $TaTe_2$, $HfTe_2$, $ReTe_2$, $TiTe_2$, $NbTe_2$, $SnTe_2$, black phosphorus, or phosphorene may be grown on hexagonal boron nitride. Besides, other various two-dimensional materials, such as $TiOx$, $NbOx$, $MnOx$, $VaOx$, $MnO_3$, $TaO_3$, $WO_3$, $MoCl_2$, $CrCl_3$, $RuCl_3$, $BiI_3$, $PbCl_4$, $GeS$, $GaS$, $GeSe$, $GaSe$, $PtSe_2$, $In_2Se_3$, $GaTe$, $InS$, $InSe$, and $InTe$, may be grown on hexagonal boron nitride.

Further, an electric device or an electronic device such as a field effect transistor (FET) may be manufactured using a two-dimensional material grown on hexagonal boron nitride. For example, FIGS. 10A to 10E are schematic perspective views illustrating a process of manufacturing a field effect transistor using hexagonal boron nitride.

Figure 10A:
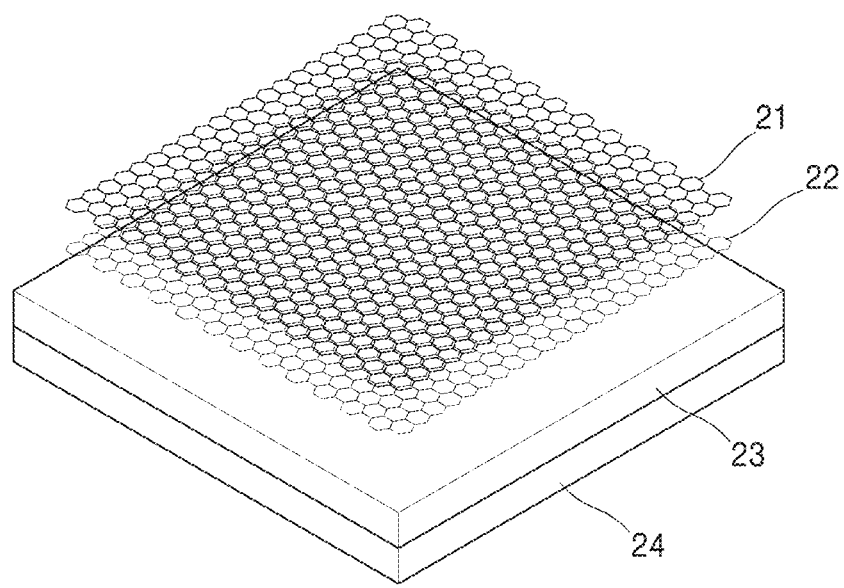
FIGS. 10A to 10E are schematic perspective views illustrating a process of manufacturing a field effect transistor using hexagonal boron nitride.

First, referring to FIG. 10A, hexagonal boron nitride 22 and graphene 21 may be placed on a silicon on insulator (SOI) substrate including silicon 23 and disposed on an insulating film 24 including an insulating material such as $SiO_2$. For example, the hexagonal boron nitride 22 coated with PMMA is transferred to the SOI substrate, and the PMMA is removed by acetone. Thereafter, the graphene 21 is transferred onto the hexagonal boron nitride 22. Alternatively, the hexagonal boron nitride 22 may be transferred onto a catalytic metal for graphene, PMMA may be removed, and then the graphene 21 may be grown on the hexagonal boron nitride 22. Thereafter, the catalytic metal for graphene is removed, and the hexagonal boron nitride 22 and the graphene 21 thereon are transferred onto the SOI substrate.

Figure 10B:
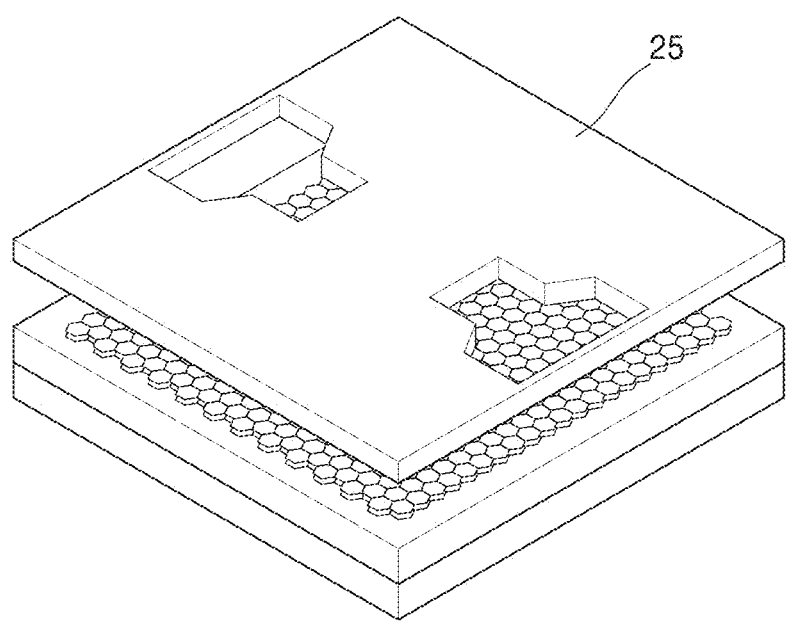
Figure 10C:
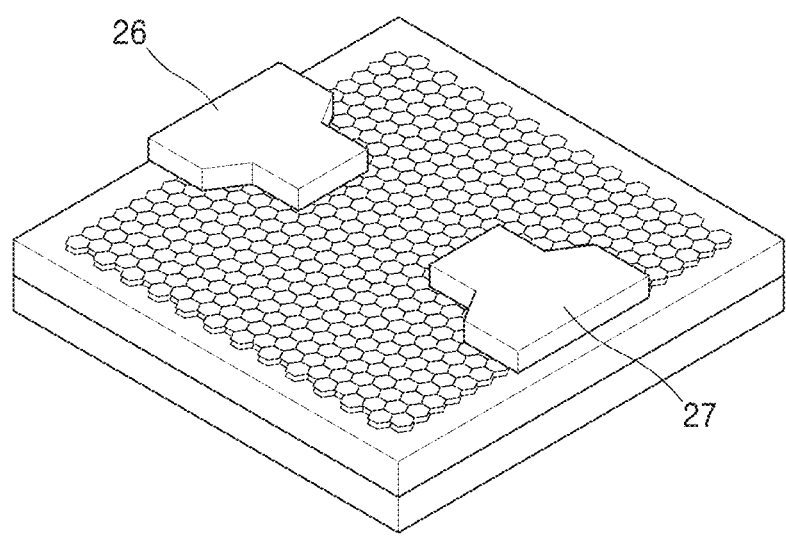
Figure 10D:
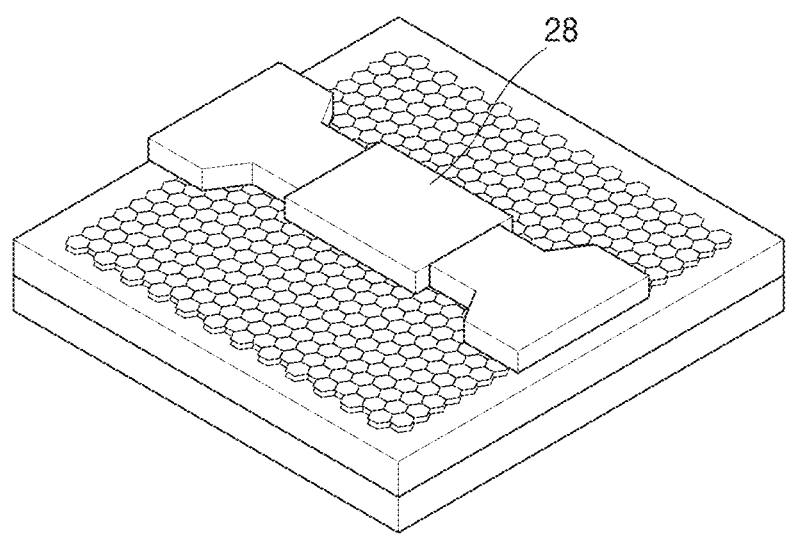
Figure 10E:
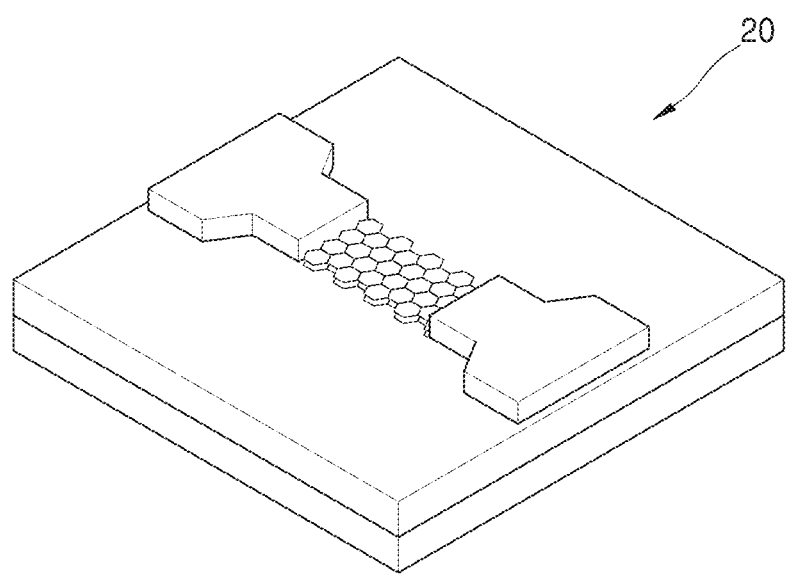

Next, referring to FIGS. 10B and 10C, a first electrode 26 and a second electrode 27 are deposited on the graphene 21 through a mask 25 by sputtering or the like. Next, referring to FIGS. 10D and 10E, except for a portion covered by a mask 28 between the first electrode 26 and the second electrode 27, remaining portions of the hexagonal boron nitride 22 and the graphene 21 are removed. For example, the hexagonal boron nitride 22 and the graphene 21 on the SOI substrate may be removed using 02 plasma. In this way, a field effect transistor 20 including a channel made of the graphene 21 may be manufactured. Here, the graphene 21 remaining between the first electrode 26 and the second electrode 27 may serve as a channel.

Although it is explained in the above description with reference to FIGS. 10A to 10E that the graphene 21 is grown on or transferred onto the hexagonal boron nitride 22, this is merely an example. In addition to the graphene 21, other various two-dimensional materials may be grown on or transferred onto the hexagonal boron nitride 22 to manufacture an electric device such as a transistor. For example, two-dimensional materials such as transition metal dichalcogenide, black phosphorus, phosphorene, TiOx, NbOx, MnOx, VaOx, $MnO_3$, $TaO_3$, $WO_3$, $MoCl_2$, $CrCl_3$, $RuCl_3$, $BiI_3$, $PbCl_4$, GeS, GaS, GeSe, GaSe, $PtSe_2$, $In_2Se_3$, GaTe, InS, InSe, and InTe may be grown on or transferred onto the hexagonal boron nitride 22 instead of the graphene 21 to manufacture an electric device such as a field effect transistor.

Figure 11:
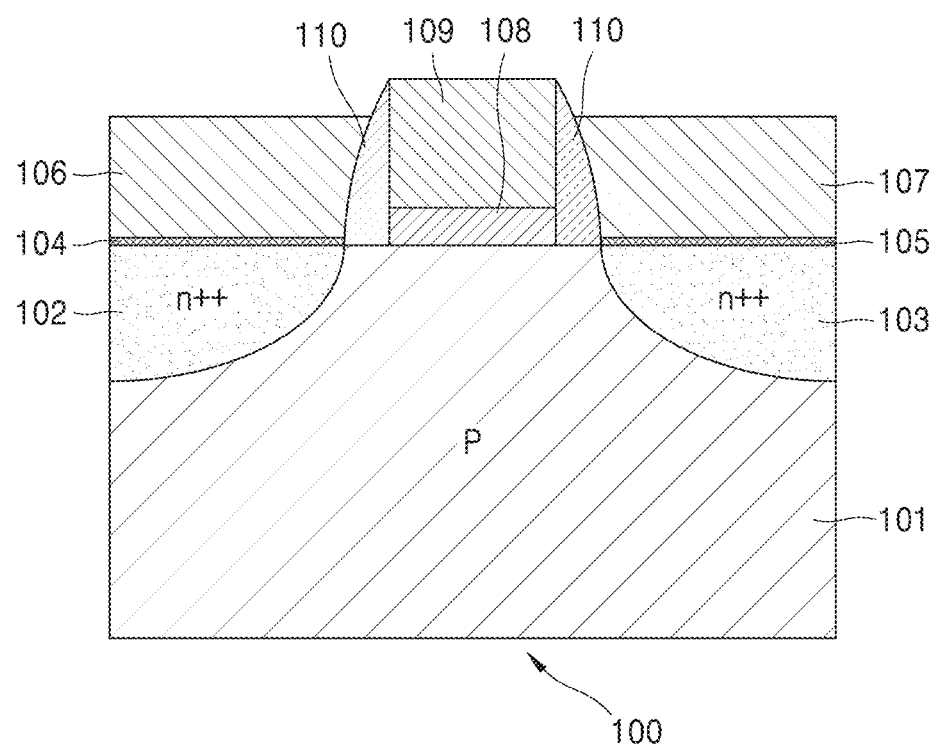
FIG. 11 is a cross-sectional view of a schematic structure of a semiconductor device including hexagonal boron nitride.

Meanwhile, hexagonal boron nitride may be interposed at an interface between a metal and a semiconductor to lower the Schottky barrier occurring at the interface between the metal and the semiconductor. For example, FIG. 11 is a cross-sectional view of a schematic structure of a semiconductor device including hexagonal boron nitride. Referring to FIG. 11, a semiconductor device 100 may include semiconductor layers 101, 102, and 103, metal layers 106 and 107 electrically contacting the semiconductor layers 101, 102, and 103, and hexagonal boron nitrides 104 and 105 disposed between the semiconductor layers 101, 102, and 103 and the metal layers 106 and 107.

Here, the semiconductor layers 101, 102, and 103 may include a well region 101 formed of a semiconductor doped with a first type dopant, and a source region 102 and a drain region 103 formed of a semiconductor doped with a second type dopant electrically opposite to the first type dopant. Although it is shown in FIG. 11 that the well region 101 is doped with a p-type dopant and the source and drain regions 102, 103 are doped with an n-type dopant, this is only an example. The well region 101 may be doped with an n-type dopant, and the source and drain regions 102, 103 may be doped with a p-type dopant.

The hexagonal boron nitrides 104 and 105 may include a first hexagonal boron nitride 104 disposed on the source region 102, and a second hexagonal boron nitride 105 disposed on the drain region 103. Although not shown in FIG. 11, as shown in FIGS. 10A to 10E, two-dimensional materials such as graphene, transition metal dichalcogenide, black phosphorus, and phosphorene may be additionally grown on or transferred onto the hexagonal boron nitrides 104 and 105.

The metal layers 106 and 107 may include a source electrode 106 disposed on the first hexagonal boron nitride 104 and a drain electrode 107 disposed on the second hexagonal boron nitride 105. The metal layers 106 and 107 including the source electrode 106 and the drain electrode 107 may include a metal such as magnesium (Mg), aluminum (Al), scandium (Sc), titanium (Ti), vanadium (V), chromium (Cr), manganese (Mn), nickel (Ni), copper (Cu), zinc (Zn), gallium (Ga), zirconium (Zr), niobium (Nb), molybdenum (Mo), lead (Pd), silver (Ag), cadmium (Cd), indium (In), tin (Sn), lanthanum (La), hafnium (Hf), tantalum (Ta), tungsten (W), iridium (Ir), platinum (Pt), gold (Au), bismuth (Bi), or an alloy thereof.

The semiconductor device 100 may further include a gate insulating film 108 disposed on the well region 101 between the source region 102 and the drain region 103, a gate electrode 109 disposed on the gate insulating film 108, and a spacer 110 surrounding the sidewalls of the gate insulating film 108 and the gate electrode 109. The well region 101, source region 102, and drain region 103 may be formed in a semiconductor substrate. The spacer 110 may limit and/or prevent the gate insulating film 108 and the gate electrode 109 from directly contacting the source electrode 106 and the drain electrode 107. The gate insulating film 108 may be formed of $SiO_2$, SiNx, $HfO_2$, $Al_2O_3$, or the like, and the gate electrode 109 may be made of polysilicon, or may be made of the same metal material as the metal layers 106 and 107. The spacer 110 may be made of an insulating material such as $SiO_2$ or SiNx.

In such a structure, the first hexagonal boron nitride 104 may lower the Schottky barrier between the source region 102 and the source electrode 106, and the second hexagonal boron nitride 105 may lower the Schottky barrier between the drain region 103 and the drain electrode 107. Therefore, the contact resistance between the source region 102 and the source electrode 106 and between the drain region 103 and the drain electrode 107 may be reduced.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A method of fabricating hexagonal boron nitride, the method comprising:

placing a catalytic metal in a chamber, the catalytic metal having a hexagonal crystal structure and having a lattice mismatch of greater than or equal to 0% and less than or equal to 15% with hexagonal boron nitride (h-BN);

removing pollutants from a surface of the catalytic metal; and growing hexagonal boron nitride on the catalytic metal at a temperature of 600° C. to 800° C. while supplying a nitrogen source and a boron source into the chamber, wherein the hexagonal boron nitride is grown directly on the catalytic metal, and the catalytic metal includes crystals osmium (Os), wherein the removing the pollutants from the surface of the catalytic metal includes supplying hydrogen ($H_2$) gas into the chamber and increasing a temperature in the chamber to 1,000° C., wherein the removing the pollutants from the surface of the catalytic metal is performed for 20 minutes while supplying the hydrogen gas at a flow rate of 100 sccm, and wherein the growing the hexagonal boron nitride provides a grown hexagonal boron nitride with a Raman spectrum having a peak at about 1370 cm$^{-1}$ and a peak at about 1450 cm$^{-1}$, and an intensity of the peak at about 1370 cm$^{-1}$ is greater than an intensity of the peak at about 1450 cm$^{-1}$.

2. The method of claim 1, wherein the catalytic metal further includes crystals of at least one of a Co—Cr alloy, a Co—N alloy, a Co—Ir alloy, and rhenium (Re).

3. The method of claim 1, wherein
the nitrogen source and the boron source include at least one of borazine, 1,3,5-trimethylborazine, 2,4,6-trimethylborazine, aminoborane, 2,4,6-trichloroborazine, B-tri(methylamino) borazine, and ammonia borane.

4. The method of claim 1, wherein the nitrogen source includes at least one of ammonia ($NH_3$) gas and nitrogen ($N_2$) gas.

5. The method of claim 1, wherein the boron source includes at least one of $BH_3$, $BF_3$, $BCl_3$, $B_2H_6$, $(CH_3CH_2)_3B$, and $(CH_3)_3B$.

6. The method of claim 1, wherein the nitrogen source and the boron source are provided by vaporizing solid boron nitride powder.

7. The method of claim 1, wherein the growing the hexagonal boron nitride is performed by inductively coupled plasma chemical vapor deposition.

8. The method of claim 1, wherein the growing the hexagonal boron nitride includes:
supplying hydrogen ($H_2$) gas into the chamber at a flow rate of 0 sccm to 100 sccm,
supplying argon (Ar) gas into the chamber at a flow rate of 0 sccm to 100 sccm,
supplying borazine gas into the chamber at a flow rate of 0.01 sccm to 1 sccm, and
maintaining pressure in the chamber at 0.01 Torr to 1 Torr.

9. The method of claim 1, wherein a lattice mismatch between the catalytic metal and the hexagonal boron nitride is greater than or equal to 0% and less than or equal to 10.4%.

10. The method of claim 1, wherein growing the grown hexagonal boron nitride and a root mean square surface roughness of the grown hexagonal boron nitride is 2 nm or less and greater than or equal to 0 nm.

11. The method of claim 10, wherein the root mean square surface roughness of the grown hexagonal boron nitride is 1.7 nm or less and greater than or equal to 0 nm.

12. The method of claim 1, wherein
the growing hexagonal boron nitride is performed after the removing the pollutants from the surface of the catalytic metal is performed.

13. A method of fabricating hexagonal boron nitride, the method comprising:
placing a catalytic metal in a chamber, the catalytic metal having a hexagonal crystal structure and including crystals of osmium (Os); and
directly growing hexagonal boron nitride on the catalytic metal at a temperature in a range of about 600° C. to about 800° C. while supplying a nitrogen source and a boron source into the chamber,
wherein the directly growing the hexagonal boron nitride provides a grown hexagonal boron nitride with a Raman spectrum having a peak at about 1370 cm$^{-1}$ and a peak at about 1450 cm$^{-1}$, and an intensity of the peak at about 1370 cm$^{-1}$ is greater than an intensity of the peak at about 1450 cm$^{-1}$.

14. The method of claim 13, wherein the directly growing hexagonal boron nitride includes:
supplying hydrogen ($H_2$) gas into the chamber at a flow rate of 0 sccm to 100 sccm,
supplying argon (Ar) gas into the chamber at a flow rate of 0 sccm to 100 sccm,
supplying borazine gas into the chamber at a flow rate of 0.01 sccm to 1 sccm, and
maintaining pressure in the chamber at 0.01 Torr to 1 Torr.

15. The method of claim 13, wherein the directly growing hexagonal boron nitride is performed by inductively coupled plasma chemical vapor deposition.

16. The method of claim 13, further comprising:
removing pollutants from a surface of the catalytic metal before the growing the hexagonal boron nitride.

17. The method of claim 13, wherein
the nitrogen source and the boron source include at least one of borazine, 1,3,5-trimethylborazine, 2,4,6-trimethylborazine, aminoborane, 2,4,6-trichloroborazine, B-tri(methylamino) borazine, and ammonia borane.

18. The method of claim 16, wherein
the removing the pollutants from the surface of the catalytic metal includes supplying hydrogen ($H_2$) gas into the chamber and increasing a temperature in the chamber to 1,000° C.,
the removing the pollutants from the surface of the catalytic metal is performed while supplying the hydrogen gas at a flow rate of 100 sccm, and
the directly growing hexagonal boron nitride is performed after the removing the pollutants from the surface of the catalytic metal is performed.

* * * * *